(12) United States Patent
Shinoda

(10) Patent No.: US 6,560,044 B2
(45) Date of Patent: May 6, 2003

(54) ILLUMINATION OPTICAL SYSTEM IN EXPOSURE APPARATUS

(75) Inventor: Ken-ichiro Shinoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/797,847

(22) Filed: Mar. 5, 2001

(65) Prior Publication Data

US 2001/0033433 A1 Oct. 25, 2001

(30) Foreign Application Priority Data

Mar. 6, 2000 (JP) .................................. 2000-060687

(51) Int. Cl.[7] .................... G02B 27/02; G02B 27/42; G02B 27/54; G01B 11/00
(52) U.S. Cl. .................... 359/800; 359/618; 359/676; 359/649; 355/53; 355/67; 356/399; 356/400
(58) Field of Search ................ 359/618, 676, 359/649, 691, 798–800; 355/53, 67; 250/201.9, 205, 227.3, 227.29; 356/399, 400

(56) References Cited

U.S. PATENT DOCUMENTS

| | | | |
|---|---|---|---|
| 4,851,882 A | * 7/1989 | Takahashi et al. | 355/46 |
| RE34,634 E | * 6/1994 | Konno et al. | 355/67 |
| 5,739,899 A | 4/1998 | Nishi et al. | 355/53 |
| 5,798,824 A | * 8/1998 | Kudo | 355/53 |
| 5,867,319 A | 2/1999 | Sugiyama et al. | 359/618 |
| 6,127,095 A | * 10/2000 | Kudo | 355/67 |
| 6,333,777 B1 | 12/2001 | Sato | 355/53 |
| 2002/0033936 A1 | * 3/2002 | Shiraishi | 355/53 |

FOREIGN PATENT DOCUMENTS

| | | |
|---|---|---|
| JP | 5-343292 | 12/1993 |
| JP | 9-26554 | 1/1997 |
| JP | 9-223661 | 8/1997 |
| JP | 11-87232 | 3/1999 |
| JP | 11-224853 | 8/1999 |

* cited by examiner

Primary Examiner—Evelyn A Lester
(74) Attorney, Agent, or Firm—Fitzpatrick, Cella, Harper & Scinto (57) ABSTRACT

An illumination optical system includes an optical integrator for forming a secondary light source by use of light from a light source, an optical system for directing light from the light source toward the integrator, and a condensing optical system for condensing light from the optical integrator upon a surface to be illuminated. The condensing optical system includes (i) a first lens group having plural lenses movable along an optical axis direction, for adjusting an illuminance distribution of light from the secondary light source upon the surface to be illuminated, without changing an angular distribution of the light from the secondary light source upon the surface to be illuminated, and (ii) a second lens group having plural lenses movable along the optical axis direction, for adjusting the angular distribution of the light from the secondary light source upon the surface to be illuminated, without changing the illuminance distribution of the light from the secondary light source upon the surface to be illuminated.

14 Claims, 9 Drawing Sheets

FIG. 7

ILLUMINATION OPTICAL SYSTEM IN EXPOSURE APPARATUS

FIELD OF THE INVENTION AND RELATED ART

This invention relates to an illumination optical system and an exposure apparatus using the same. More particularly, the invention is suitably applicable to an illumination system in an exposure apparatus for use in a micro-lithography process in the manufacture of various devices having a very fine pattern structure, such as semiconductor devices, liquid crystal devices, or magnetic devices, for example.

In exposure apparatuses used for semiconductor device manufacture, a higher and higher resolution has been required to meet further increases in density of each semiconductor device. A super-resolution technology using oblique incidence illumination or a phase shift mask is known, in this respect. In such super-resolution technology, an aperture stop of an illumination optical system is changed to make smaller, the sigma value (the ratio between the numerical aperture (NA) of a projection optical system and the numerical aperture (NA) of an illumination optical system), or a secondary light source of a particular shape such as a ring-like shape or quadruple shape, for example, is produced.

Further, exposure apparatuses for semiconductor device manufacture generally include an optical system which is telecentric on the image side, such that there occurs substantially no positional deviation of an image even if a photosensitive substrate such as a wafer is at a defocused position.

However, with recent increases in density of VLSIs, an extraordinarily high transfer precision is required in the photolithographic exposure of a circuit pattern, and it is very important to correctly set an angular distribution of exposure light incident on a photosensitive substrate. If the incidence angle of the exposure light incident on the photosensitive substrate is not proper, and when the photosensitive substrate is at a defocused position, a positional deviation of an image occurs. Any deviation in incidence angle of the exposure light with respect to the photosensitive substrate, produced with respect to the magnification and about the optical axis center (i.e., an error in the magnification telecentricity), if the photosensitive substrate is defocused, causes a positional deviation, in a printed pattern, of the magnification component corresponding to the image height.

This means that, during plural lithographic processes, an image shift occurs when a circuit pattern is printed superposedly upon a photosensitive substrate having a surface step formed thereon, and it is very unadvisable with respect to the manufacture of high precision semiconductor devices.

In many exposure apparatuses, positions of components of an illumination optical system are so adjusted that, in a certain standard illumination mode A, exposure light of an optimum angular characteristic and illuminance distribution can be supplied. However, when the illumination mode is changed from illumination mode A to another illumination mode B such as oblique incidence illumination or small-sigma illumination, for example, if the components of the illumination optical system are held at the same positions as in the illumination mode A, the angular characteristic of the exposure light cannot always be made optimum and, also, the illuminance distribution changes. This is mainly because the light path is different for different illumination modes, and the influence of an anti-reflection film applied to an optical element changes with the angle of light rays.

SUMMARY OF THE INVENTION

It is accordingly an object of the present invention to provide an exposure apparatus by which high illuminance uniformness and correct angular characteristic can be assured in every illumination mode of exposure light.

In accordance with an aspect of the present invention, there is provided an illumination optical system characterized by means for changing an illuminance distribution and an angular distribution of illumination light, independently of each other.

In accordance with another aspect of the present invention, there is provided an illumination optical system including an optical integrator for forming a secondary light source by use of light from a light source, and a condenser optical system for condensing light from said optical integrator upon a surface to be illuminated, characterized in that said condenser optical system is arranged to change, independently of each other, an illuminance distribution and an angular distribution of the light incident on the surface illuminated.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2A is a schematic view for explaining distortion and an illuminance distribution in a first state of a first lens group 6a.

FIG. 2B is a schematic view for explaining distortion and an illuminance distribution in a second state of the first lens group 6a.

FIG. 2C is a schematic view for explaining distortion and an illuminance distribution in a third state of the first lens group 6a.

DESCRIPTION OF THE PREFERRED EMBODIMENTS

Preferred embodiments of the present invention will now be described with reference to the accompanying drawings.

Figure 1:
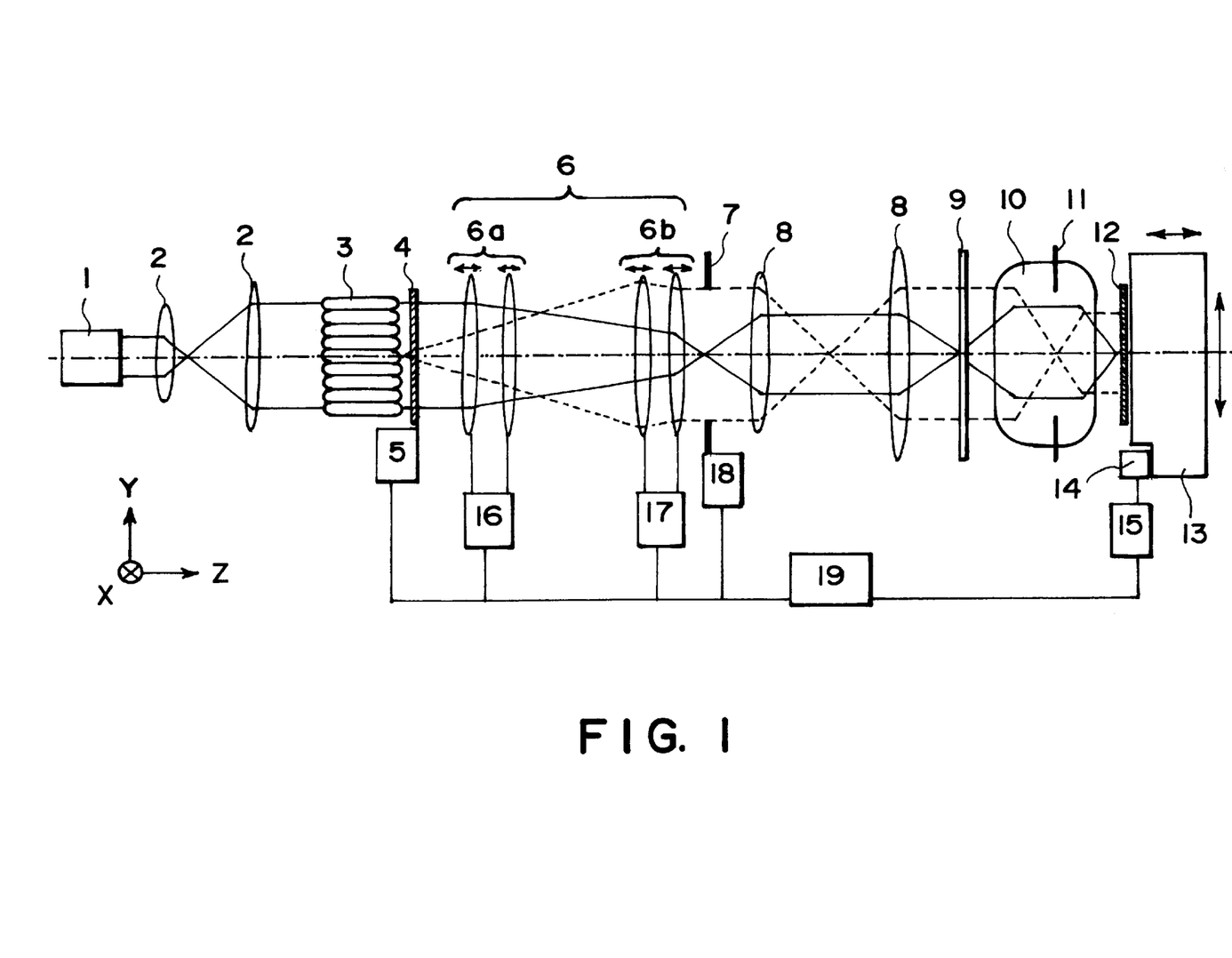
FIG. 1 is a schematic view, illustrating an optical path in an exposure apparatus which includes an illumination optical system according to an embodiment of the present invention.

FIG. 1 shows the structure of an optical system, for explaining a general structure of an exposure apparatus according to an embodiment of the present invention. Denoted at 1 is a light source means for supplying illumination light, and denoted at 2 is a relay lens for directing the light from the light source to an optical integrator 3 which comprises a fly's eye lens, in this embodiment. The optical integrator 3 serves to form a number of light source images (secondary light sources) adjacent to a light exit surface thereof. While in this embodiment the optical integrator is provided by a fly's eye lens, an optical pipe for mixing light rays from a light source to provide a surface light source at the light exit surface thereof may be used as an optical integrator.

There is a stop 4 adjacent to the light exit surface of the optical integrator 3, and the size and shape of an aperture of the stop 4 can be changed by means of a stop driving mechanism 5. By setting an optimum aperture shape of this stop 4 in accordance with a pattern of a reticle 9, the light intensity distribution to be formed on a pupil plane 11 of a projection optical system 10 is controlled.

Denoted at 6 is a condenser optical system for providing superposed Koehler illumination of a masking blade surface 7 (opening thereof) with light from the optical integrator 3. It comprises a first lens group 6a and a second lens group 6b. The first lens group 6a can be driven in an optical axis direction by means of a first driving mechanism 16, thereby to change the illuminance distribution upon the masking blade surface 7 (surface to be illuminated) symmetrically. The second lens group 6b can be driven in the optical axis direction by means of a second driving mechanism 17, thereby to change the angular distribution (magnification telecentricity) of the light incident on the masking blade surface 7.

The masking blade 7 comprises a plurality of movable plates, and it can be actuated by a masking blade driving mechanism 18 to move these masking blades to desired positions, thereby to define a desired aperture shape.

Denoted at 8 is an imaging lens for transferring an aperture shape of the masking blade 7 onto a reticle 9 (which is one surface to be illuminated), to restrict the illumination region to a required region.

Denoted at 10 is a projection optical system for projecting the pattern of the reticle 9 in a reduced scale, and denoted at 12 is a wafer (photosensitive substrate) onto which the reticle pattern is to be transferred. Denoted at 13 is an X-Y stage for holding the wafer 12 and being movable two-dimensionally along a plane orthogonal to the optical axis. For the function to be described later, preferably the X-Y stage 13 should be arranged to be moved upwardly and downwardly along the optical axis, by a predetermined amount or more.

In the optical system of this embodiment, the light entrance surface of the optical integrator 3 the aperture of the masking blade 7 as well as the reticle 9 surface and the wafer 12 surface are placed in an optically conjugate relation. Also, the aperture of the stop 4 and the pupil plane 11 of the projection optical system 10 are placed in an approximately conjugate relation. The masking blade 7 surface, the reticle 9 surface and the wafer 12 surface are the surfaces to be illuminated, in this embodiment.

Denoted at 14 is a detector for measuring the illuminance distribution on the wafer 12 surface. It is made movable within the illumination field region with the drive of the X-Y stage to receive the exposure light, and a signal corresponding to its output is applied to a detecting system 15.

A main control unit 19 serves to control the stop driving mechanism 5, the detecting system 15, the first and second driving mechanisms 16 and 17 for driving the first and second lens groups 6a and 6b, respectively, and the masking blade driving mechanism 18.

Figure 2A:
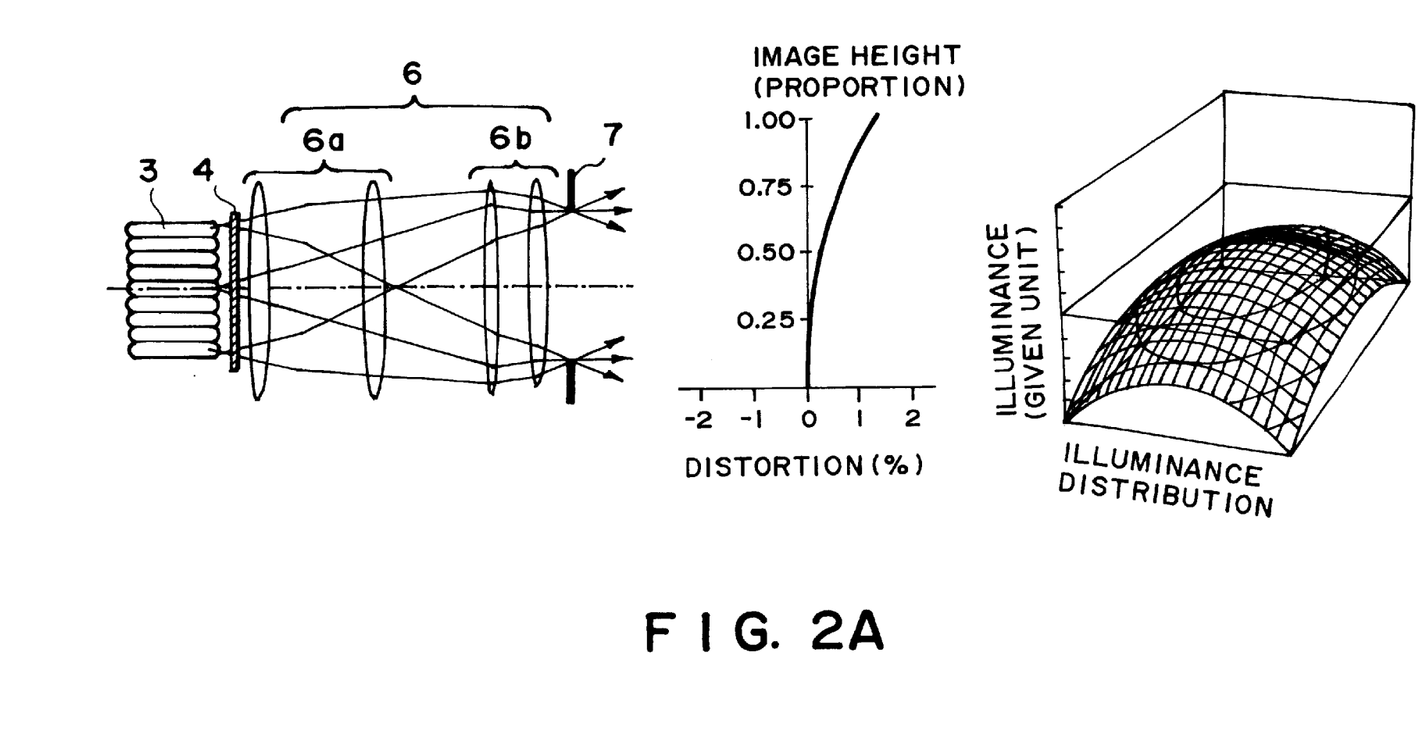
Figure 2B:
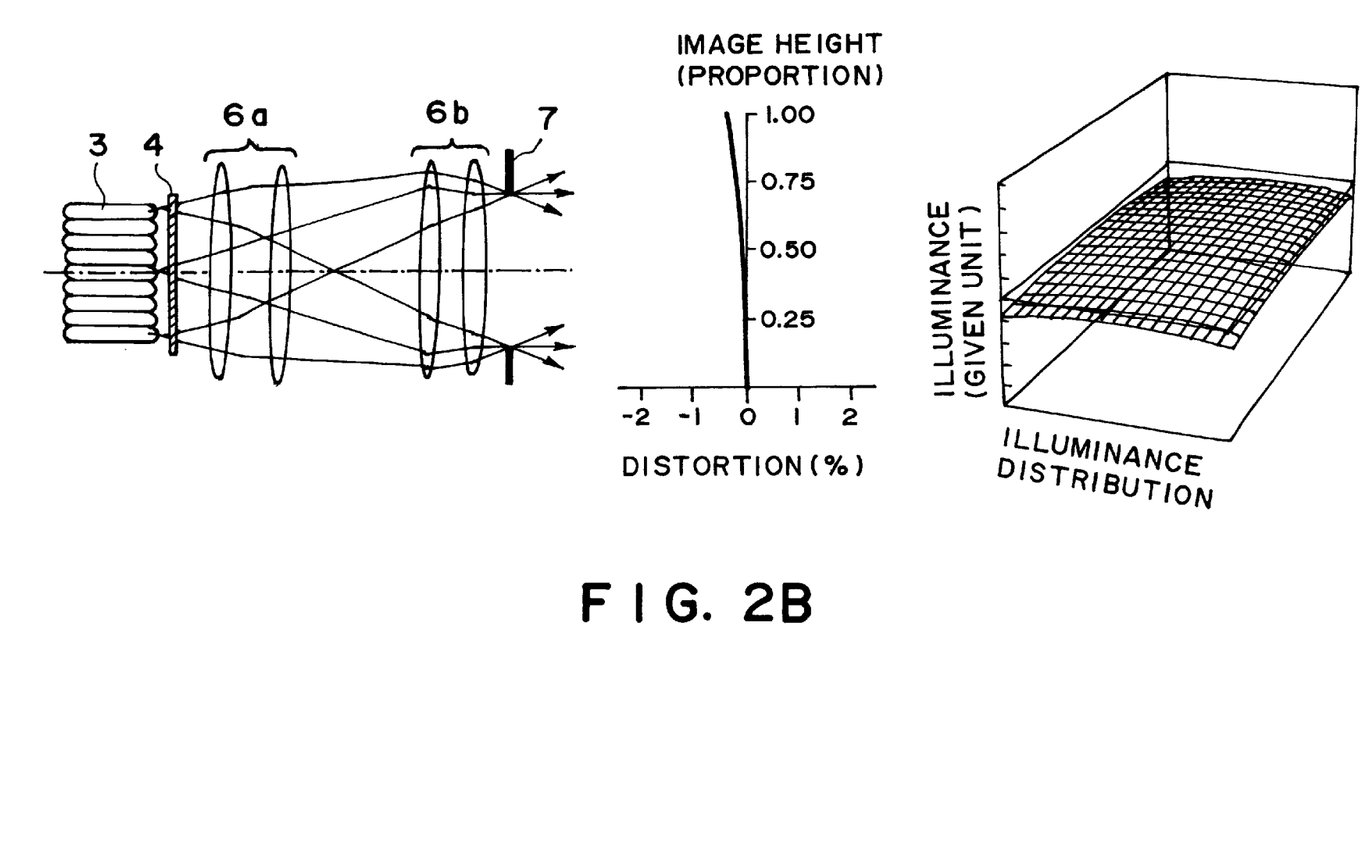
Figure 2C:
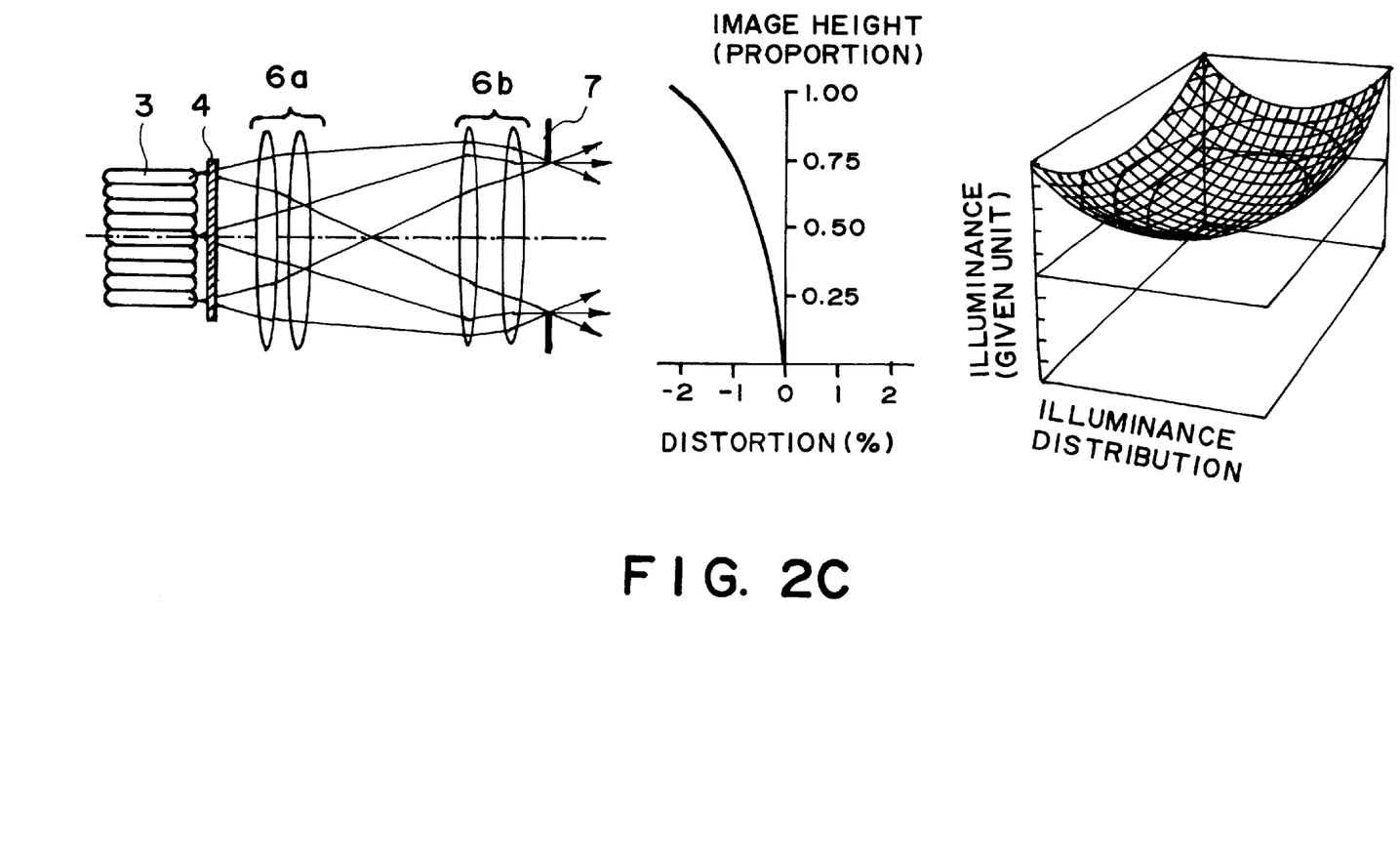

FIGS. 2A, 2B and 2C are schematic views of optical paths, respectively, for explaining the function of the condenser optical system 6.

First, the first driving mechanism 16 will be described. The first driving mechanism 16 is a mechanism which serves to move the first lens group 6a in the optical axis direction, thereby to change the illuminance distribution on the masking blade surface 7 symmetrically with respect to the optical axis and also approximately linearly. More specifically, this change of illuminance distribution is caused by changing the distortion of the condenser optical system 6.

Namely, as shown in FIG. 2A, when the first lens group 6a is moved so as to produce a distortion in a positive direction, and illuminance distribution in which the illuminance at a peripheral portion is reduced symmetrically with respect to the optical axis, as compared with the illuminance on the optical axis, is produced.

Further, when the first lens group 6a is moved as shown in FIG. 2B, the distortion becomes close to zero, and a substantially flat illuminance distribution is provided.

Further, when the first lens group 6a is moved as shown in FIG. 2C to produce a distortion in the negative direction, an illuminance distribution in which the illuminance is higher at the periphery is produced.

Since the masking blade surface 7 is conjugate with the wafer 12 surface, by changing the illuminance distribution on the masking blade surface 7, the illuminance distribution on the wafer 12 surface can also be changed.

The first lens group 6a comprises at least two lens elements. These lens elements are made movable along the optical axis direction independently of each other, to change the distortion but to keep other performance (illumination NA, telecentricity or uniformness of effective light source, for example) substantially unchanged.

To this end, a final lens (a lens closest to the surface to be illuminated) of the first lens group 6a should preferably be a negative meniscus lens having a concave surface facing to the surface to be illuminated. By moving this negative meniscus lens in the optical axis direction, a difference is caused in the light ray height of the abaxial chief ray passing through this meniscus lens, whereby the distortion is changed effectively. On the other hand, since the spherical aberration caused by this meniscus lens is cancelled by a lens disposed before it, at the same time there in an advantage that the partial sum of the spherical aberration coefficient at the first lens group 6a is unchanged with the lens motion. Here, it is to be noted that, although in these drawings the lens elements of the first lens group 6a are all illustrated as being a biconvex lens, this is only for illustration and the first lens group is not limited to this.

FIG. 2B shows a case wherein the illuminance distribution becomes flat as the distortion is near zero, for convenience in explanation. Practically, there are cases wherein the illuminance distribution does not become flat even if the distortion is near zero. This is because the small lenses of the fly's eye lens, constituting the optical integrator, are single lenses so that a sine condition is not satisfied, and because the characteristic of an anti-reflection film or the characteristic of a glass material transmission factor applies an influence to the illuminance distribution.

In consideration of the above, in order that the illuminance distribution can be adjusted while satisfying the performance such as the illumination NA or the uniformness of the effective light source, for example, it is desirable to design the structure so as to change the distortion within the negative region.

Further, as regards the distortion Y(%) at different picture angles of the condenser optical system 6, in proper correction of the illuminance distribution, it should preferably be designed to change while satisfying the relation:

$$Y = D \times X^n \quad (1.5 \leq n \leq 3.0).$$

when the proportion of the picture angle is X ($0 \leq X \leq 1$) and the distortion at the largest picture angle (X=1) is D(%).

Figure 3A:
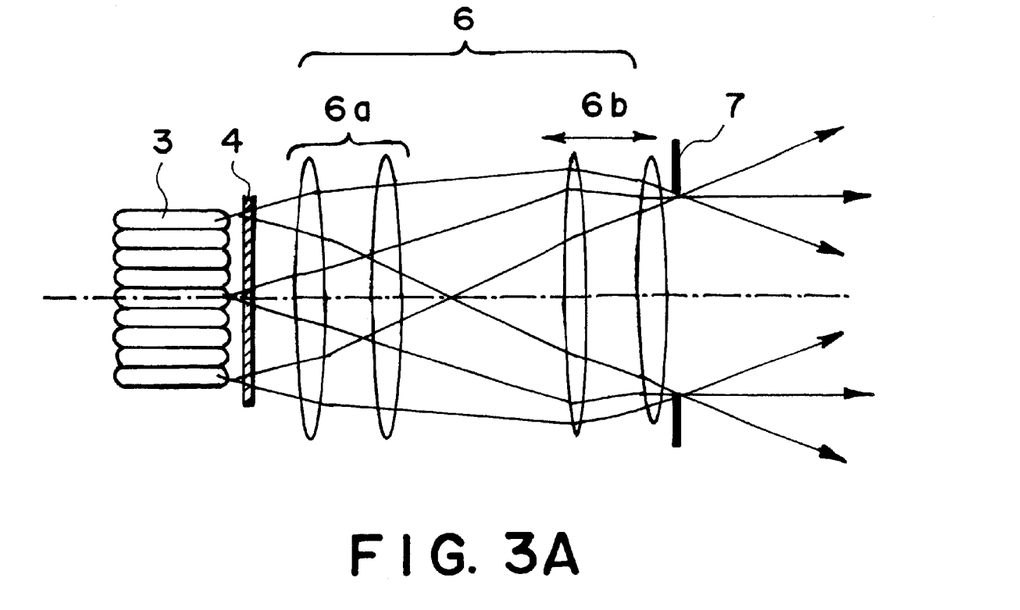
FIGS. 3A and 3B are schematic views, respectively, for explaining the relation between the position of a second lens group 6 and the magnification telecentricity.
Figure 3B:
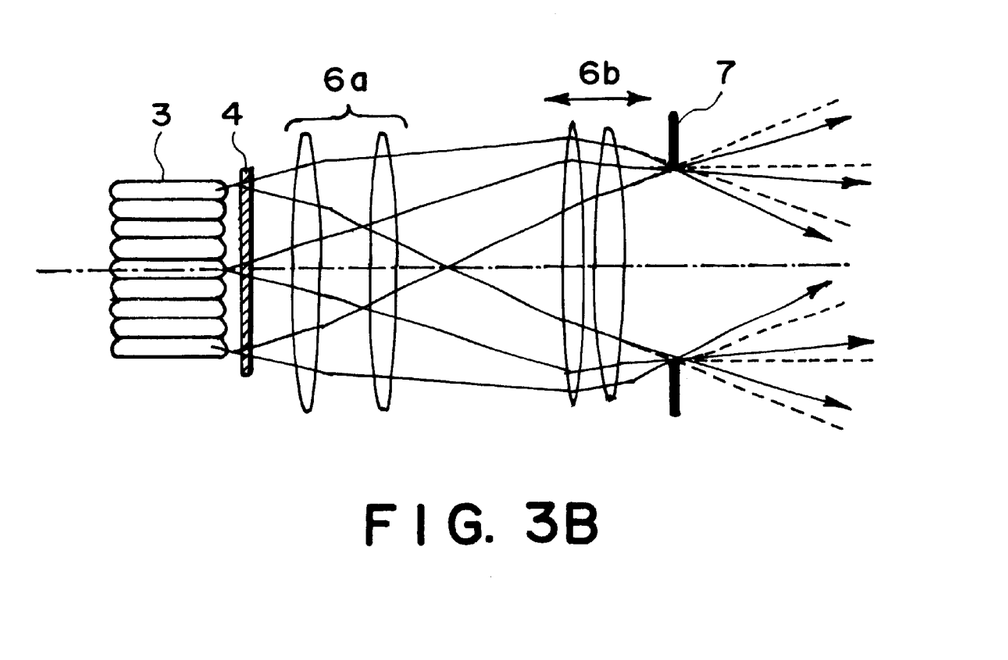

Next, the second driving mechanism 17 will be described. The second driving mechanism 17 is a mechanism which serves to move plural lens elements of the second lens group 6b in the optical axis direction to change the edit pupil position of the condenser optical system 6, thereby to change the magnification telecentricity substantially linearly.

FIGS. 3A and 3B are schematic views of optical paths, for explaining the function of the second lens group 6b. It is arranged so that, with the drive of the second lens group 6b, the angular distribution (magnification telecentricity) of light incident on the masking blade can be changed, but the other performance (such as illumination NA, distortion, or uniformness of the effective light source, for example) is kept substantially unchanged.

The condenser optical system 6 is an optical system adapted to define Koehler illumination of the masking blade 7 surface by use of the light emitted from the optical integrator 3. Thus, the inclination of the abaxial chief ray is large at the position of the first lens group 6a, but it is small at the second lens group 6b position and is substantially parallel to the optical axis.

This means that, for effective change of distortion, it should be done at the position where the difference of the light ray height of the abaxial chief ray is large, that is, the position at the first lens group 6a near the optical integrator 3.

As described above, the condenser optical system 6 having the correcting mechanism described above is incorporated into the illumination optical system, by which the illuminance distribution of exposure light for exposure of a photosensitive substrate as well as the angular distribution (magnification telecentricity) can be changed independently of each other. Thus, the illuminance distribution and the angular distribution (magnification telecentricity) which are changeable for various causes in response to the change of illumination modes, can be corrected to appropriate values, respectively.

Figure 4:
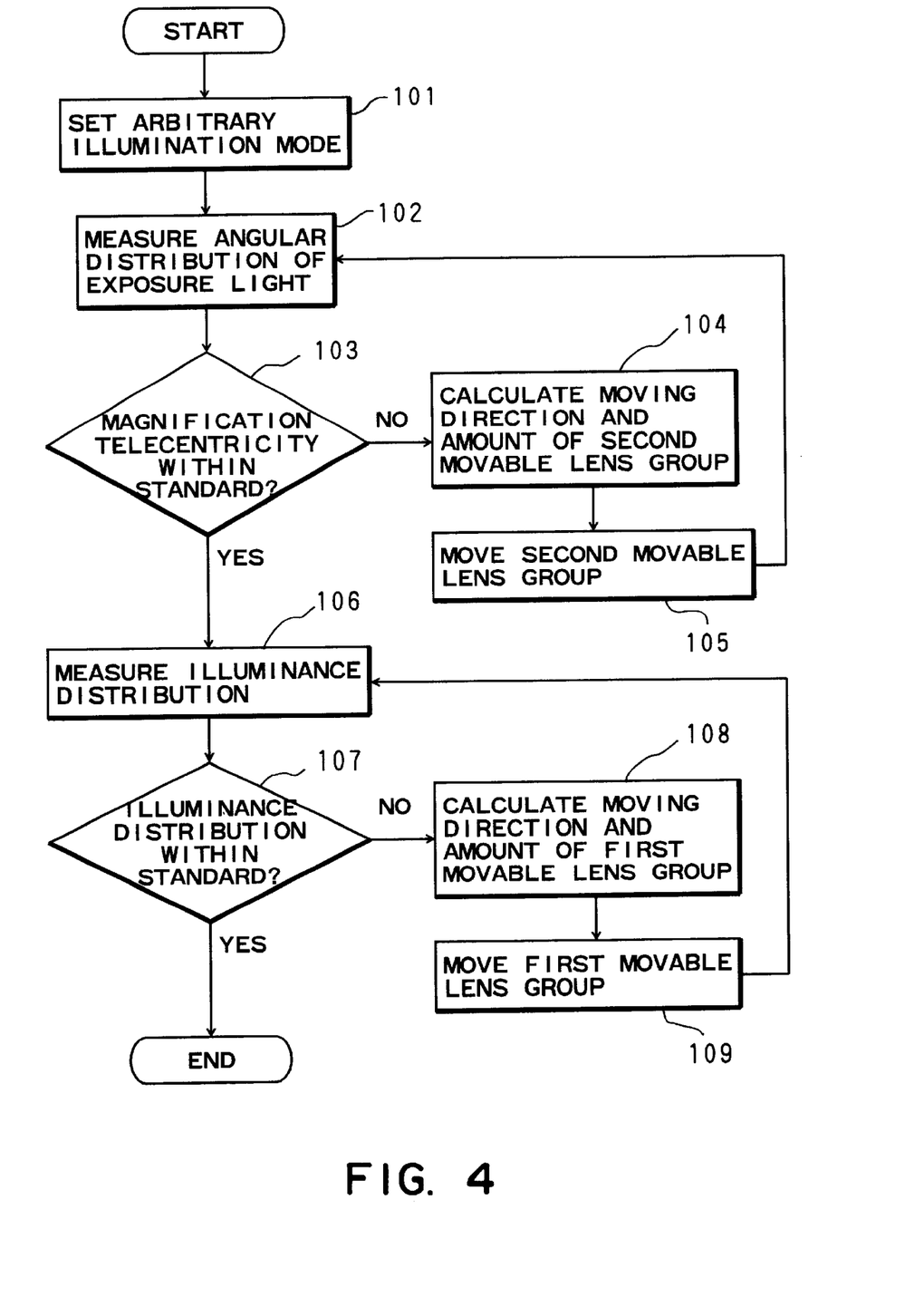
FIG. 4 is a flow chart for explaining the procedure of correcting the magnification telecentricity and the illuminance distribution, in an embodiment of the present invention.

FIG. 4 is a flow chart for explaining the procedure of correcting the illuminance distribution and the angular distribution of the exposure light.

First, in response to the change of illumination modes in step 101, the angular distribution of the exposure light is measured, at step 102.

Figure 5A:
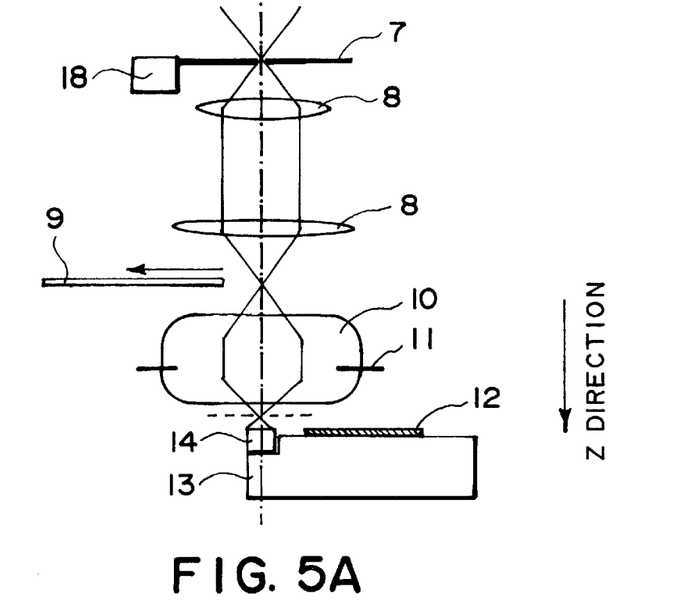
FIGS. 5A and 5B are schematic views, respectively, each for explaining a method of measuring an angular distribution of exposure light, in an embodiment of the present invention.

The angle of exposure light can be measured in various ways. An example is a method in which the masking blade driving unit 18 is actuated so that the masking blade 7 defines a small aperture at the position corresponding to the image height to be measured, and on the other hand, the detector 14 is defocused in the optical axis Z direction by a predetermined amount from a practical water reference plane. Here, the reticle 9 may be placed out of the optical path. FIG. 5A shows the state of the apparatus, corresponding to this. Only the exposure light restricted by the masking blade 7 can be imaged once upon the wafer surface, and is incident on the detector 14 while reflecting the incidence angle. There is a pinhole of a sufficiently small diameter as compared with the expansion of the light beam, at the above of the light receiving surface of the detector 14. By moving this detector 14 horizontally with the X-Y stage 13 in a range in which, for example, the light is expanded in a two-dimensional matrix, the intensities of lights at different positions can be measured, such that the angle of exposure light can be detected. In place of the detector, a two-dimensional CCD may be used for simultaneous measurement.

Figure 5B:
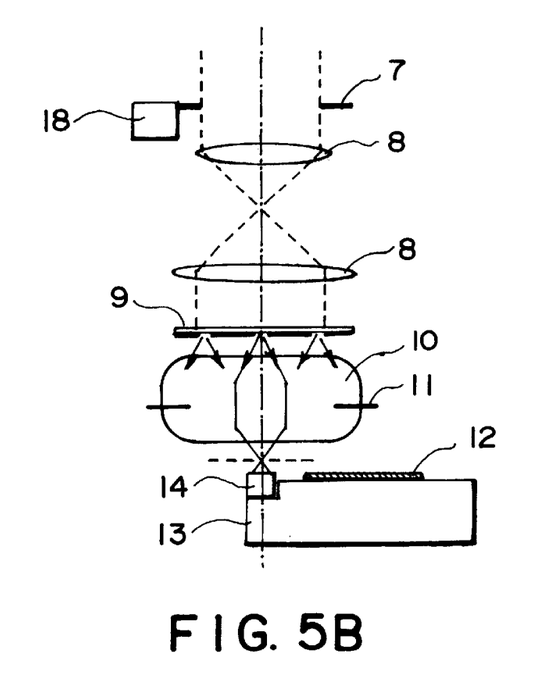

Alternatively, a small opening may be defined at a position conjugate with the masking blade 7, by which a similar measurement can be done. More specifically, as shown in FIG. 5B, while the masking blade 7 is opened, a special reticle having a small aperture defined by a chromium pattern may be disposed.

As a further alternative, while the detector 14 is not defocused, a small aperture may be provided at a position defocused, by a predetermined amount, from the reticle 9 surface in a direction opposite to the optical axis Z direction, by which measurement can be done. On that occasion, as the small aperture, a special reticle having a small aperture defined by a chromium pattern on its top face, rather than the bottom face as usual, may be used.

With the procedure described above, on the basis of measurement in regard to points on the optical axis, the telecentricity (shift component) along the optical axis can be measured. With the measurement made to a suitable image height, magnification telecentricity can be measured.

The angular distribution information as measured and detected is supplied to the main control unit 19, and the amount of deviation of the magnification telecentricity is calculated. Subsequently, whether the calculated deviation is within the standard or not is discriminated, at step 103. If it is out of the standard, for correction of this, at step 104, the main control unit 19 calculates the movement amount and the movement direction of the second lens group 6b, and the unit 19 supplies a signal to the second driving mechanism 17. In response, at step 105, the second lens group 6b is moved by a predetermined amount and in a predetermined direction, obtained by the calculation. Then, the sequence goes back to the drive control step 102, and the angular distribution of the exposure light is measured again. If the deviation of the magnification telecentricity is within a proper range, the sequence goes to a next step 106. If not, the procedure described above is repeated, until a proper value is attained.

If the angular distribution (deviation in magnification telecentricity) of the exposure light is best, at step 106, the detector 14 is moved horizontally to plural points within the exposure region by means of the X-Y stage 13. The light intensity at respective positions is measured, by which the illuminance distribution is measured. At step 107, whether the illuminance distribution satisfies the standard value or not is discriminated.

If the illuminance distribution satisfies the standard, the sequence is completed. If not so, at step 108, the main control unit 19 calculates the movement amount and the movement direction of the first lens group, and thus the first driving unit 16 drives the first lens group 6a by a predetermined amount and in a predetermined direction, obtained by the calculation. After this, the sequence goes back to step 106, and the measurement is made again to bring the illuminance distribution to satisfy the standard.

As regards the illuminance distribution correcting means, in addition to the correction of the optical axis symmetrical component through the drive of the movable lens group 6a, a wedge-shaped optical element, for example, may be used as required to correct the tilt-component illuminance distribution. This assures higher illuminance uniformness.

Next, an embodiment of a semiconductor device manufacturing method which uses an exposure apparatus such as described above, will be explained.

Figure 6:
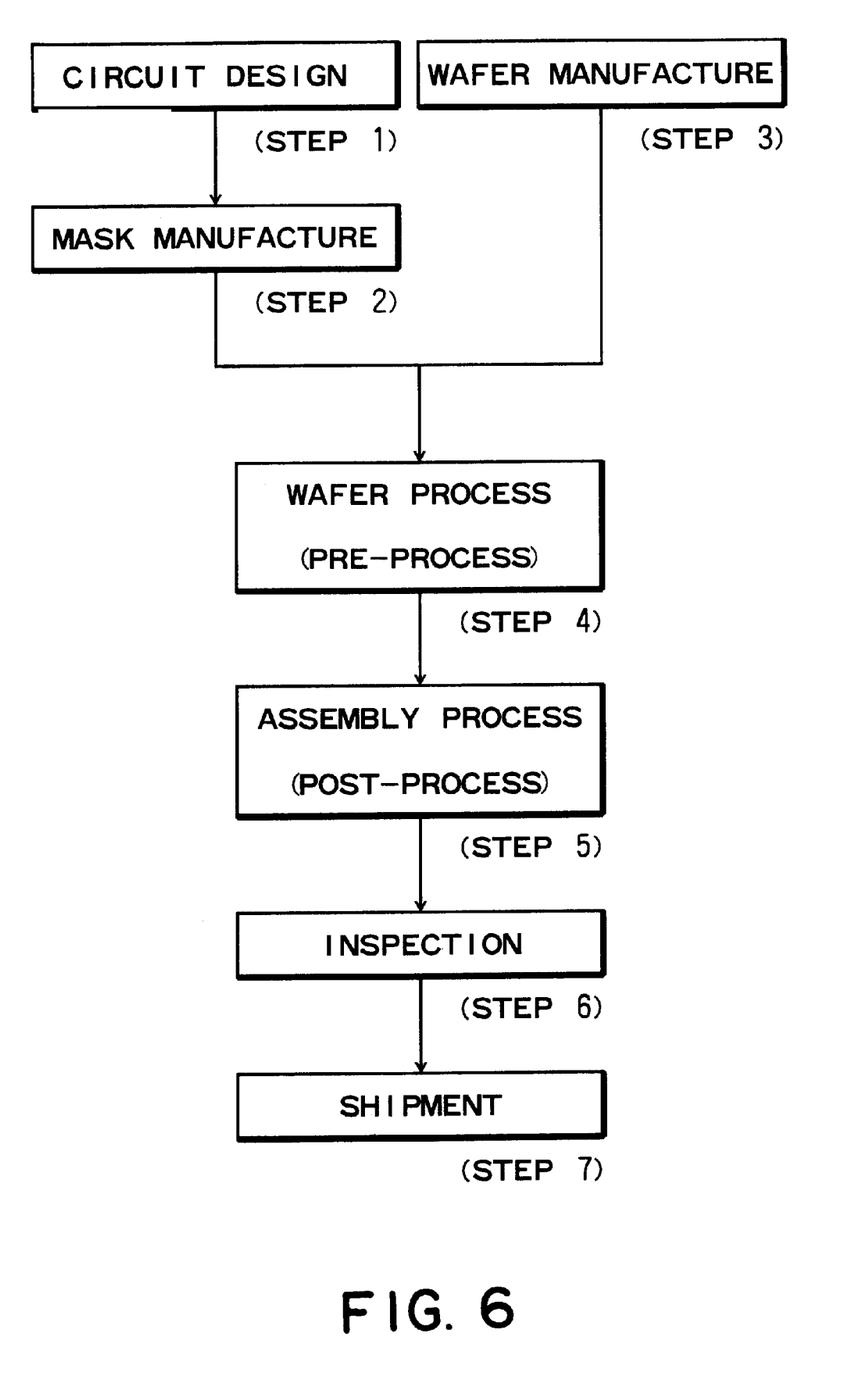
FIG. 6 is a flow chart of semiconductor device manufacturing processes.

FIG. 6 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre- process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
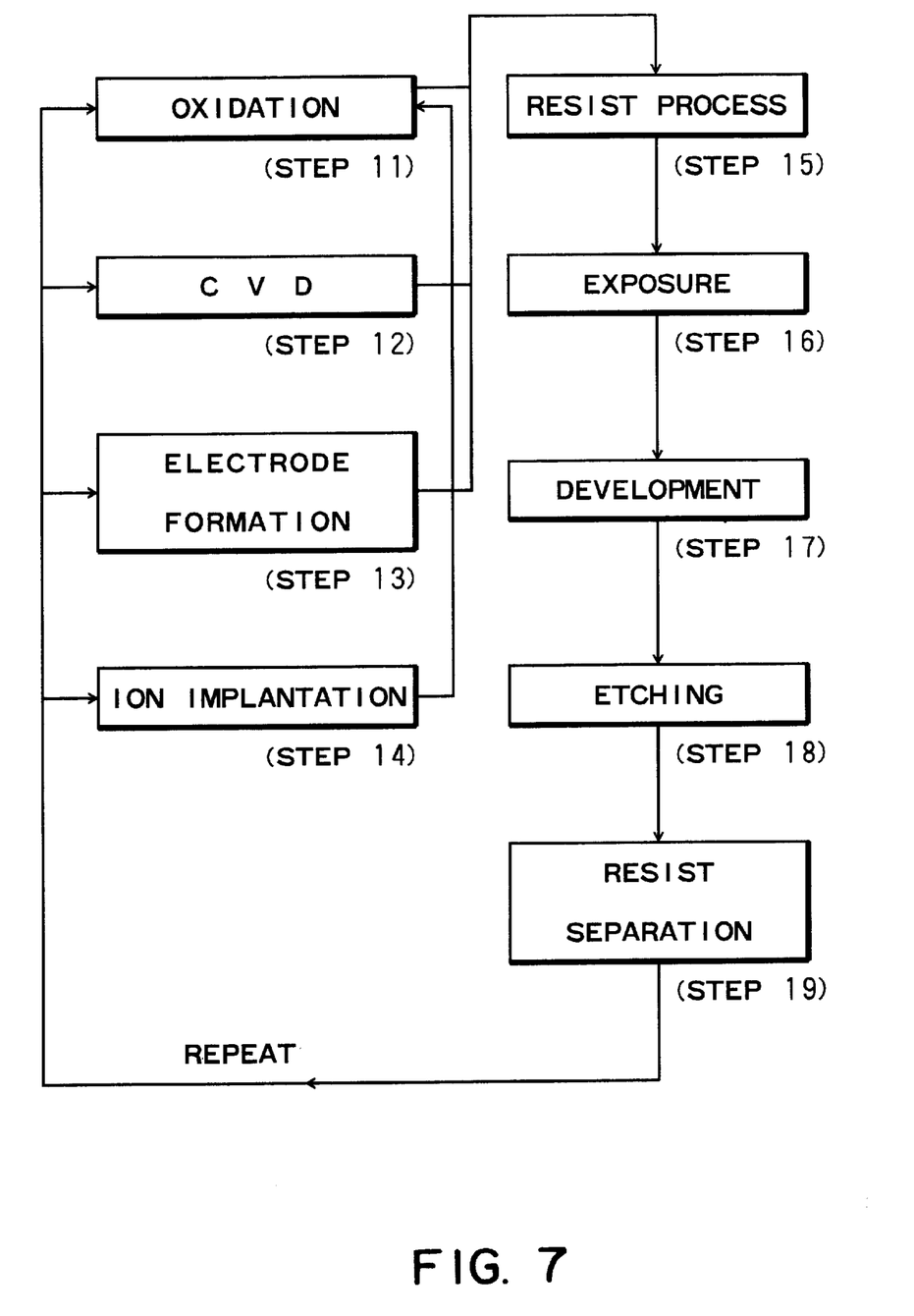
FIG. 7 is a flow chart for explaining details of a wafer process included in the procedure of FIG. 6.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, the function for adjusting the angular distribution (magnification telecentricity) and the illuminance distribution independently of each other is incorporated into a condenser lens in an illumination optical system. Thus, the present invention can provide an exposure apparatus in which exposure light of a proper angular characteristic (telecentricity) and high illuminance uniformness can be accomplished in every illumination mode.

While the invention has been described with reference to the structures disclosed herein, it is not confined to the details set forth and this application is intended to cover such modifications or changes as may be within the purposes of the improvements or the scope of the following claims.

What is claimed is:

1. An illumination optical system, comprising:
   an optical integrator for forming a secondary light source by use of light from a light source;
   an optical system for directing light from the light source toward said integrator; and
   a condensing optical system for condensing light from said optical integrator upon a surface to be illuminated, wherein said condensing optical system includes (i) a first lens group having plural lenses movable along an optical axis direction, for adjusting an illuminance distribution of light from the secondary light source upon the surface to be illuminated, without changing an angular distribution of the light from the secondary light source upon the surface to be illuminated, and (ii) a second lens group having plural lenses movable along the optical axis direction, for adjusting the angular distribution of the light from the secondary light source upon the surface to be illuminated, without changing the illuminance distribution of the light from the secondary light source upon the surface to be illuminated.

2. An illumination optical system according to claim 1, wherein said condensing optical system includes a first lens group and a second lens group in an order along the advancement of the light, and said first lens group is actuated to change the illuminance distribution on the surface illuminated, while said second lens group is actuated to change the angular distribution of the light incident on the surface.

3. An illumination optical system according to claim 1, wherein said first lens group includes at least two lens elements which are movable along an optical axis direction independently of each other to change distortion on the surface illuminated, thereby to change the illuminance distribution.

4. An illumination optical system according to any one of claim 1, wherein said first lens group includes at least two lens elements which are movable along an optical axis direction independently of each other to correct a change in a focal distance and an aberration, other than distortion, thereby to change the illuminance distribution on the surface.

5. An illumination optical system according to claim 4, wherein one of said at least two lenses, which is close to the surface to be illuminated, comprises a negative meniscus lens having a concave surface facing to the surface.

6. An illumination optical system according to claim 1, wherein said second lens group is movable along an optical axis direction to change the angular distribution of the light incident on the surface, about an optical axis and with respect to a magnification, while correcting a change in a focal distance and an aberration.

7. An illumination optical system according to claim 1, wherein, when the proportion of the image height is $X(0 \leq X \leq 1)$ and the distortion at the most abaxial image height $(X=1)$ is $D(\%)$, the distortion $Y(\%)$ of said condensing optical system at different image heights satisfied a relation:

$$Y = D \times X^n \, (1.5 \leq n \leq 3.0).$$

8. An exposure apparatus, comprising:
   an illumination optical system as recited in claim 1, for illuminating a pattern of a mask; and
   a projection optical system for projecting the pattern onto a photosensitive substrate.

9. An apparatus according to claim 8, further comprising detecting means for detecting an angular distribution and an illuminance distribution of exposure light incident on the photosensitive substrate, and driving means for driving a first lens group and a second lens group, respectively, in accordance with a result of the detection by said detecting means.

10. An apparatus according to claim 9, wherein said detecting means is arranged to detect a change in an illuminance distribution on the photosensitive substrate as an illumination condition for illumination of the mask is changed, and a change in an angular distribution of the exposure light incident on the photosensitive substrate, and wherein the illuminance distribution and the angular distribution of the exposure light incident on the photosensitive substrate are corrected on the basis of a result of a detection by said detecting means.

11. An exposure method for projecting a pattern of a mask onto a photosensitive substrate by use of an exposure apparatus as recited in claim 8, said method comprising the steps of:

detecting a change in an illuminance distribution on the photosensitive substrate produced with a change in an illumination condition for illumination of the mask, and a change in an angular distribution of exposure light incident on the photosensitive substrate; and correcting the illuminance distribution and the angular distribution on the basis of a result of the detection, by adjusting a condensing optical system.

12. A device manufacturing method, comprising the steps of:

exposing a photosensitive substrate with a pattern of a mask by use of an exposure apparatus as recited in claim 8; and developing the exposed substrate.

13. An illumination optical system for illuminating a surface to be illuminated, with light from a light source, said illumination optical system comprising:

a first optical system for adjusting an illuminance distribution of the light upon the surface to be illuminated, without changing an angular distribution of the light upon the surface to be illuminated; and a second optical system for adjusting the angular distribution of the light upon the surface to be illuminated, without changing the illuminance distribution of the light upon the surface to be illuminated.

14. An exposure apparatus for exposing a substrate to be exposed, with exposure light and through a mask, said apparatus comprising:

a first optical system for adjusting an illuminance distribution of the light upon the substrate, without changing an angular distribution of the light upon the substrate; and a second optical system for adjusting the angular distribution of the light upon the substrate, without changing the illuminance distribution of the light upon the substrate.

* * * * *